US012567513B2

(12) United States Patent
Ott

(10) Patent No.: US 12,567,513 B2
(45) Date of Patent: Mar. 3, 2026

(54) GROUNDING ELEMENT AND ELECTRICAL INSTALLATION COMPONENT HAVING A GROUNDING ELEMENT

(71) Applicant: Eaton Intelligent Power Limited, Dublin (IE)

(72) Inventor: Toni Ott, Neckargemünd (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 136 days.

(21) Appl. No.: 17/924,830

(22) PCT Filed: May 11, 2021

(86) PCT No.: PCT/EP2021/025179
§ 371 (c)(1),
(2) Date: Nov. 11, 2022

(87) PCT Pub. No.: WO2021/228435
PCT Pub. Date: Nov. 18, 2021

(65) Prior Publication Data
US 2023/0215595 A1      Jul. 6, 2023

(30) Foreign Application Priority Data

May 12, 2020    (DE) ......................... 102020112829.0

(51) Int. Cl.
*H01B 1/02*      (2006.01)
*C22C 18/00*      (2006.01)
*C22C 21/10*      (2006.01)
*H05K 5/02*      (2006.01)

(52) U.S. Cl.
CPC .............. *H01B 1/02* (2013.01); *C22C 18/00* (2013.01); *C22C 21/10* (2013.01); *H01B 1/023* (2013.01); *H05K 5/0247* (2013.01)

(58) Field of Classification Search
CPC ........................................................ H01B 1/02
USPC ............................................................ 174/51
See application file for complete search history.

(56) References Cited

U.S. PATENT DOCUMENTS

| | | | | |
|---|---|---|---|---|
| 3,343,930 A * | 9/1967 | Borzillo | .................... | C23C 2/12 |
| | | | | 428/653 |
| 4,628,283 A * | 12/1986 | Reynolds | .................. | H01P 7/10 |
| | | | | 333/219.1 |
| 5,316,165 A * | 5/1994 | Moran, Jr. | ............... | H02B 1/40 |
| | | | | 229/165 |
| 6,652,295 B1 * | 11/2003 | Glass | .................... | H01R 9/2483 |
| | | | | 439/94 |
| 10,056,168 B2 * | 8/2018 | Choi | ......................... | C08K 3/04 |
| 10,913,994 B2 | 2/2021 | Shimoda | | |
| 2003/0077952 A1 * | 4/2003 | Steenkiste | .............. | H01R 13/03 |
| | | | | 427/180 |

(Continued)

FOREIGN PATENT DOCUMENTS

WO        2019/049307 A1      3/2019

OTHER PUBLICATIONS

International Search Report and Written Opinion issued in International Application No. PCT/EP2021/025179, mailed Aug. 30, 2021, 11 pages.

*Primary Examiner* — Stanley Tso
(74) *Attorney, Agent, or Firm* — Talem IP Law, LLP

(57)      ABSTRACT

A grounding element for electrically grounding an electrical installation component has a steel sheet component that is provided with a coating that constitutes an alloy.

19 Claims, 2 Drawing Sheets

(56)                    References Cited

U.S. PATENT DOCUMENTS

| 2004/0154818 | A1* | 8/2004 | Franks, Jr. | ............. | H01R 4/643 |
| | | | | | 174/51 |
| 2008/0308290 | A1* | 12/2008 | Lalancette | ............. | H02G 3/086 |
| | | | | | 174/51 |
| 2019/0265426 | A1* | 8/2019 | Zhejian | ................ | G02B 6/4477 |
| 2020/0181751 | A1* | 6/2020 | Shimoda | ............... | B32B 15/043 |
| 2020/0361021 | A1* | 11/2020 | Furusako | ............... | B23K 11/24 |
| 2022/0220598 | A1* | 7/2022 | Köhler | ................ | C21D 8/0205 |

* cited by examiner

GROUNDING ELEMENT AND ELECTRICAL INSTALLATION COMPONENT HAVING A GROUNDING ELEMENT

CROSS-REFERENCE TO RELATED APPLICATIONS

This application is the U.S. National Stage Application of International Application No. PCT/EP2021/025179, filed May 11, 2021, which claims the benefit of German Patent Application Serial No. 102020112829.0, filed May 12, 2020 which are hereby incorporated by reference in their entirety.

BACKGROUND

Field of the Invention

The present invention relates to a grounding element according to the preamble of claim 1 and to an electrical installation component, having such a grounding element, according to claim 11.

Description of Related Art

Electrical installation components, such as terminal boxes, lights, switches, distribution systems, control devices, or the like must be provided with grounding. The term "grounding" refers to the totality of all means and measures for grounding, i.e., for discharging electric currents into the earth. A "ground" is an electrically conductive connection that facilitates potential equalization and thus minimizes electric potential differences. In electrical systems, such a potential equalization or such grounding is required according to various standards in order to protect a user against electric shock. The requirements for potential equalization in explosion-protected electrical systems are even more comprehensive. This ensures that no dangerous potential differences arise, which can lead to an ignitable spark, which in turn would trigger an explosion.

Known electrical installation components, such as junction boxes, terminal boxes, lights, switching distribution systems, control devices, and the like have an insulating, outer housing, which on the one hand serves to protect the enclosed components and on the other hand insulates the enclosed components toward the outside and thus prevents a user from touching voltage parts and receiving an electric shock. In order to realize the required grounding, a grounding element is provided in known systems and is electrically connected to a ground connection arranged outside the housing.

Known grounding elements are formed as ground plates, which are arranged inside the insulating housing. Such ground plates may be formed from brass, which offers the advantage that a corresponding ground plate still has a sufficient low contact resistance due to the, even after prolonged use in a corrosive environment. Thus, even after conditioning in an environment with 90% relative humidity and at a temperature of 95° C. for four weeks followed by a further two weeks at 80° C., the contact resistance is still in a range below 5 mohms.

Disadvantages of such ground plates made of brass are the high costs, in particular in the case of larger components, due to the expensive raw material.

Alternatively, galvanized steel sheet is therefore used as the starting material, in particular galvanized zinc surfaces being used. This offers the advantage of reduced production costs in combination with a certain corrosion resistance.

However, the use of galvanized zinc layers on a steel sheet has the disadvantage that such layers develop unacceptable contact resistances over time in a corrosive environment. This is due to the partial conversion of the zinc into zinc oxide, which is a semiconductor, and therefore has a comparatively low electric conductivity.

BRIEF SUMMARY

The object of the present invention is to create a grounding element for electrically grounding an electrical installation component, wherein the grounding element has a steel sheet component, which is provided with a coating with which these disadvantages are overcome.

This object is achieved by a grounding element according to the characteristic portion of claim 1 and by an electrical installation component, having such a grounding element, according to claim 11.

According to the present invention, the coating of the grounding element consists of an alloy. This offers the advantage that the properties of the coating can be optimized both with respect to corrosion resistance and with respect to conductivity. While components that are completely made of brass or steel sheet components, which are zinc-coated are used in known grounding elements, a steel sheet component is used in a grounding element according to the present invention (and a cost reduction in comparison to brass components is thus achieved). By selecting an alloy rather than using pure zinc, the corrosion problem can be reduced.

Further preferred embodiments of the present invention result from the dependent claims.

In a particularly preferred embodiment of the invention, the alloy comprises zinc and aluminum. The provision of zinc in the alloy utilizes the good properties of this element as corrosion protection for the underlying steel. The addition of aluminum leads to a significant increase in the electric conductivity of zinc oxide, which can form in particular in a corrosive environment. In this case, the conductivity of the zinc oxide is increased by a factor of up to 1000. The effect is caused by the property of aluminum as dopant for the semiconductor zinc oxide. This doping of the zinc oxide with aluminum thus substantially improves the electric conductivity of the zinc oxide. The addition of aluminum to the zinc furthermore leads to an improvement in the process stability when coating the steel sheet component with such an alloy.

A grounding element in which the alloy is applied by means of a hot dip method is particularly preferred. Hot dipping is a coating method in which the electrical installation component or a corresponding semi-finished product for producing such an electrical installation component is immersed in a molten bath ("hot bath") of the zinc aluminum alloy so that after the workpiece has been lifted out of the molten bath, the liquid alloy forms a solid metallic coating on the workpiece after cooling. The use of a hot dip method represents a simple and cost-effective method for applying a particular alloy since the two components zinc and aluminum simply have to be contained in the melt in the corresponding ratio.

Alternatively, the alloy may be applied by means of an electroplating method.

Due to the different surface structures of coatings applied by means of a hot dip method or an electroplating method, which method was used can be deduced from the finished grounding element. For example, coatings applied by means of a hot dip method have typical surface structure ("flowers"). These do not occur in the case of electroplated coatings.

In a further grounding element according to the invention, the alloy has zinc as the base, a proportion of 40 to 70 wt. % of aluminum, and a proportion of 0 to 5 wt. % of silicon. The term "base" should be understood to mean that, in addition to the stated weight percentages of the components aluminum and silicon and impurities (preferably a proportion of less than 1 wt. %, particularly preferably less than 0.1%, or below 0.01%), the alloy substantially consists only of zinc.

As already explained, the addition of 40 to 70 wt. % of aluminum serves to increase the conductivity of zinc oxide. The addition of 0 to 5 wt. % of silicon serves to further improve the corrosion resistance of the alloy.

In a further preferred embodiment of such an alloy with zinc as the base, the alloy has a proportion of 50 to 60 wt. % of aluminum and a proportion of 1 to 2 wt. % of silicon.

Alternatively, according to the invention, an alloy can be used in which zinc is likewise provided as the base, but the aluminum is provided with a proportion of only 1 to 10 wt. % and (instead of silicon) 1 to 10 wt. % of magnesium. The low weight proportion of aluminum is sufficient to provide the desired doping of the zinc oxide. The addition of 1 to 10 wt. % of magnesium improves the corrosion resistance of the coating.

An alloy that has, in addition to zinc as the base, 3 to 4 wt. % of aluminum (in particular 3.5%) and 2 to 4 wt. % of magnesium (in particular 3 wt. %) is particularly preferred.

In a further preferred embodiment of the present invention, the coating has a layer thickness of 2 to 25 μm, in particular of 5 to 10 μm. Minimum layer thicknesses of 5 to 10 μm on the one hand offer the advantage that they permanently offer good corrosion protection for the steel sheet component when using an alloy according to the invention and on the other hand represent a cost-effective solution with respect to the material consumption for the coating.

In a particularly preferred embodiment of the present invention, the grounding element has a contact resistance of less than 6 mohms. This offers the advantage that good grounding properties can be realized and the corresponding specifications and standards for use in a potentially explosive environment can be maintained.

In the case of an electrical installation component according to the invention, the electrical installation component is designed in particular as a junction box, terminal box, light, switch, switching distribution system, or control device and has a housing and a grounding element according to one of the previous embodiments.

Through the use of a grounding element according to the invention, the electrical installation component is in particular designed for use in potentially explosives areas. This can be realized by corresponding seals that ensure a gas-tight, water-tight, pressure-tight, and/or dust-tight sealing of the housing.

In a preferred embodiment of a corresponding electrical installation component, the housing is designed as an outer, insulating housing. This offers the advantage that the housing on the one hand protects electrical components arranged inside the housing. On the other hand, people are protected from contact with live parts and live parts are shielded from a potentially explosive environment. In this case, the grounding element is arranged inside the housing but has an electrical connection to a ground connection of the electrical installation component arranged outside the housing. This advantageously ensures that the grounding element can be grounded for potential equalization.

Preferably, the connection between the grounding element and the outside ground connection is designed such that the corresponding IP (Ingress Protection) protection level of the insulating housing is maintained. This can be realized by corresponding seals that ensure a gas-tight, water-tight, pressure-tight, and/or dust-tight sealing of an electrically conductive feedthrough through the housing.

In a further preferred embodiment of an electrical installation component according to the invention, the insulating housing is electrostatically dissipative. This means that the housing can reduce any electric charge in a controlled manner. For this purpose, it forms a resistance that is connected to ground.

To this end, a surface or shunt resistance of the housing is preferably above that of an electrically conductive housing but below the shunt resistance of a completely insulating housing. A surface or shunt resistance of between $10^6$ ohms and $10^9$ ohms is particularly preferred.

BRIEF DESCRIPTION OF DRAWINGS

The invention is explained by way of example in more detail below with reference to the figures.

The following are shown.

DETAILED DESCRIPTION

Figure 1:
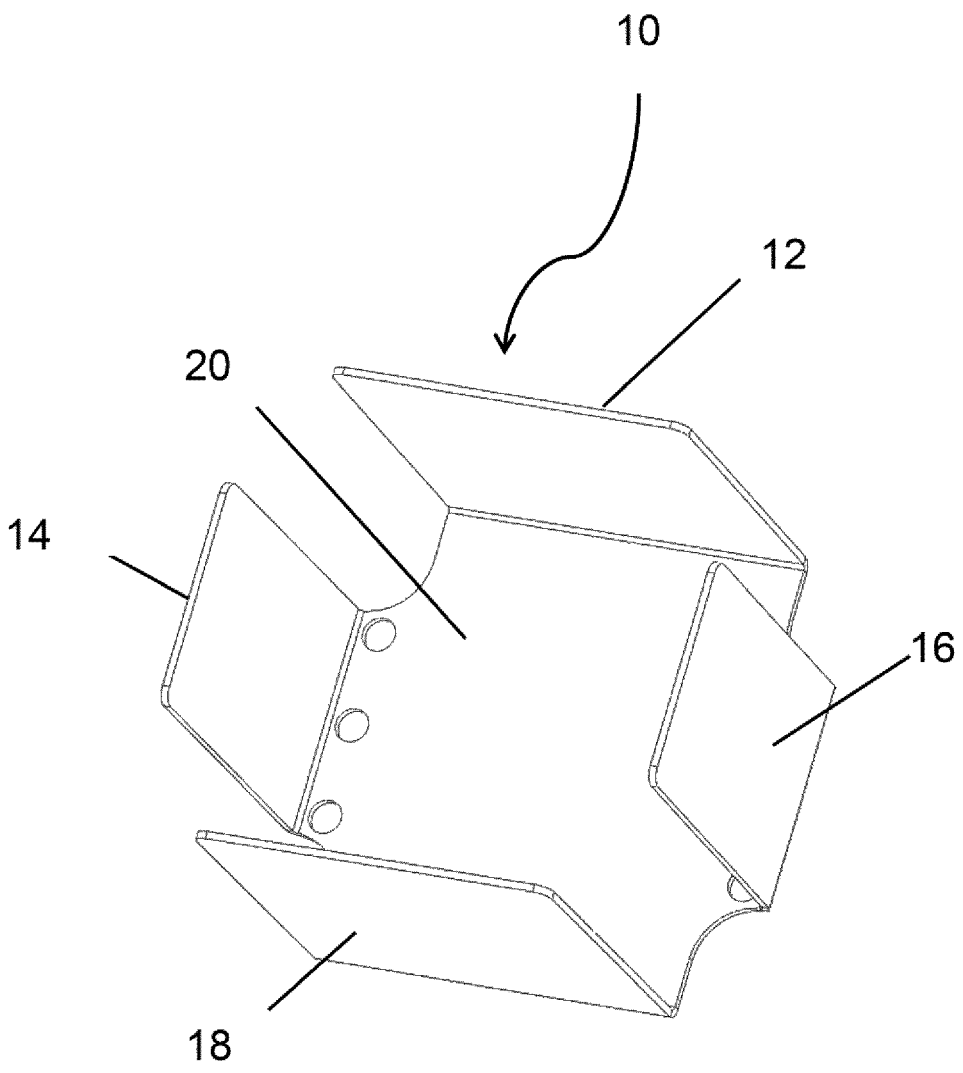
FIG. 1 a grounding element according to the invention.

FIG. 1 shows a perspective view of a grounding element 10 having side faces 12, 14, 16, and 18 arranged at right angles on a base plate 20 of the grounding element 10. The base plate 20 is substantially square or rectangular, and the side faces 12, 14, 16, and 18 substantially all extend in the same direction away from the base plate 20.

According to the invention, the grounding element 10, which is formed as a steel sheet component, has a coating that constitutes an alloy. In this case, the coating of the grounding element 10 is an alloy that has zinc as the main component, i.e., as the base. Further components of the alloy are aluminum and silicon. Aluminum has a proportion of 55 wt. % in the alloy. At a proportion of 1.6 wt. % of silicon, a proportion of 43.4 wt. % of zinc remains (in addition to possibly smaller amounts of impurities, below 1 wt. %, preferably below 0.1% or particularly preferably below 0.01%).

Alternatively, in addition to the zinc as the base in the alloy, a proportion of significantly less aluminum may also be provided, for example 3.5 wt. %, and instead of the silicon, a proportion of 3 wt. % of magnesium, resulting in a zinc proportion of 93.5%.

In the alloys according to the invention, the aluminum serves for doping the semiconductor zinc oxide, which forms after the coating of the grounding element 10 with the alloy, in particular under corrosive conditions, in order to thus increase the conductivity of the zinc oxide. The further additives of silicon or magnesium serve to improve the process stability and the corrosion resistance of the alloy.

Figure 2:
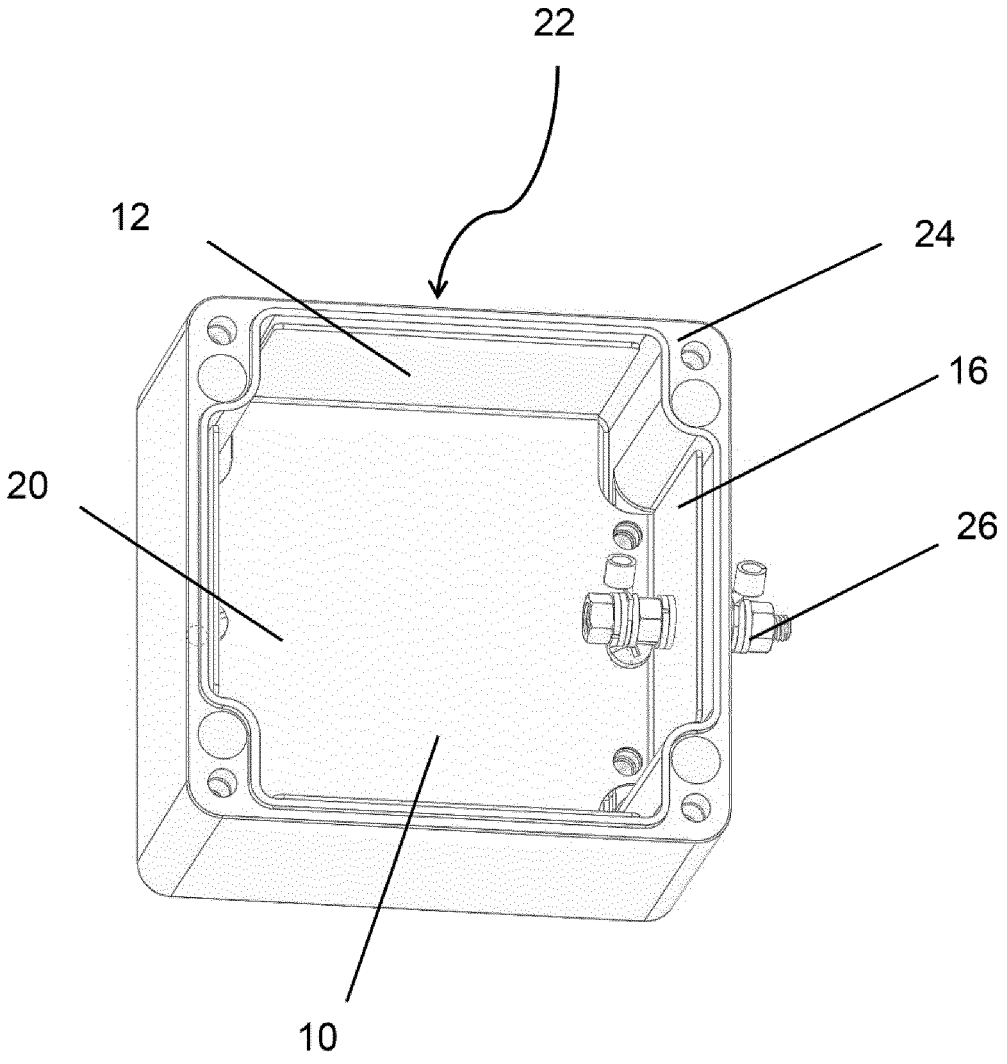
FIG. 2 a terminal box having such a grounding element.

FIG. 2 shows a terminal box 22 having a housing 24 inside of which the grounding element 10 of FIG. 1 is arranged. The housing 24 is designed as a synthetic material or plastic housing. In this case, the housing 24 preferably has a discharge capacity that prevents, or at least reduces, an electrostatic charge.

The terminal box 22 of FIG. 2 serves for the electrical connection of various components of a system and can accommodate terminal strips (not shown in detail), for example. The insulating housing 24 ensures that the live parts arranged in the interior of the housing 24 are not accessible or accessible only with tools. The components in the interior of the housing 24 are shielded from dust, water, and explosive gases or environmental substances. A spark arising inside the housing 24 thus does not lead to an explosion even if the terminal box 22 is used in a potentially explosive environment.

In order to be able to connect the grounding element 10 to an electrical ground or a corresponding potential outside the housing 24, a ground connection 26 is arranged on an outside of the housing 24 and is in electrically conductive connection with the grounding element 10 through a passage. In this case, the connection between the grounding element 10 arranged inside the insulating housing 24 and the ground connection 26 arranged on the outside is designed such that the corresponding IP protection level of the insulating housing 24 is maintained. For example, in the case of a housing 24 protecting against water according to a particular IP code, a corresponding water-tight seal is to be provided. In an environment that is potentially explosive due to explosive gases or dusts, a corresponding gas- or dust-tight seal is provided.

The use according to the invention of a grounding element 10 in the form of a steel sheet component, which is coated with an alloy of zinc and aluminum, ensures that the grounding element 10 permanently meets the conductivity requirements even in an aggressive and corrosive environment. On the other hand, production costs can be kept low.

Particularly preferred in this case is a grounding element 10 in which corresponding alloy is applied by means of a hot dip method or a hot bath.

LIST OF REFERENCE SIGNS

10 Grounding element
12 Side face
14 Side face
16 Side face
18 Side face
20 Base plate
22 Terminal box
24 Housing
26 Ground connection

The invention claimed is:

1. An electrical installation component comprising:
a housing; and
a grounding element located within the housing for electrically grounding an electrical installation component, wherein the grounding element has a steel sheet component that is provided with a coating, wherein the coating is an alloy, and
wherein the electrical installation component is intended to be used in explosive atmospheres, and
wherein the electrical installation component is a junction box, terminal box, light, or switching distribution system, and
wherein the alloy comprises:
zinc as the base,
3 to 4 wt. % of aluminum,
2 to 4 wt. % of magnesium.

2. The electrical installation component according to claim 1, wherein the housing is designed as an outer insulating housing and the grounding element is arranged at inside walls of the housing, wherein the grounding element is electrically connected to a ground connection of the electrical installation component arranged outside the housing.

3. The electrical installation component according to claim 2, wherein the connection between the grounding element located inside the insulating housing and the ground connection located on the outside is designed such that the ingress protection level of the insulating housing is maintained.

4. The electrical installation component according to claim 1, wherein the housing is electrostatically dissipative.

5. The electrical installation component according to claim 4, wherein the housing has a surface resistance of $<10^9$ ohms.

6. The electrical installation component according to claim 5, wherein the housing has a surface resistance of $>10^6$ ohms.

7. The electrical installation component according to claim 1, wherein the alloy contains zinc and aluminum.

8. The electrical installation component according to claim 1, wherein the alloy is applied by means of a hot dip method.

9. The electrical installation component according to claim 1, wherein the alloy is applied by means of an electroplating method.

10. The electrical installation component according to claim 1, wherein the coating has a layer thickness of 2 to 25 μm.

11. The electrical installation component according to claim 1, wherein the coating has a layer thickness of 5 to 10 μm.

12. The electrical installation component according to claim 1, wherein the grounding element has a contact resistance of less than 6 mohms.

13. The electrical installation component of claim 1, wherein the housing is electrically insulating.

14. The electrical installation component of claim 13, wherein the electrically insulating housing is designed as a synthetic material housing or plastic housing.

15. An electrical installation component comprising:
a housing; and
a grounding element located within the housing for electrically grounding an electrical installation component, wherein the grounding element has a steel sheet component that is provided with a coating, wherein the coating is an alloy,
wherein the alloy comprises the following:
zinc as the base,
3 to 4 wt. % of aluminum, and
2 to 4 wt. % of magnesium,
wherein the electrical installation component is a junction box, terminal box, light, or switching distribution system.

16. The electrical installation component of claim 15, wherein the housing is electrically insulating.

17. The electrical installation component of claim 16, wherein the electrically insulating housing is designed as a synthetic material housing or plastic housing.

18. An electrical installation component comprising:
an electrically insulating housing; and
a grounding element located within the electrically insulating housing for electrically grounding an electrical installation component, wherein the grounding element has a steel sheet component that is provided with a coating, wherein the coating is an alloy, wherein the alloy comprises the following:

zinc as the base, 3 to 4 wt. % of aluminum, 2 to 4 wt. % of magnesium;

wherein the electrically insulating housing is designed as an outer electrically insulating housing and the grounding element is arranged at inside walls of the electrically insulating housing, wherein the grounding element is electrically connected to a ground connection of the electrical installation component arranged outside the electrically insulating housing, wherein the connection between the grounding element located inside the electrically insulating housing and the ground connection located on the outside is designed such that the ingress protection level of the electrically insulating housing is maintained.

19. The electrical installation component of claim 18, wherein the electrically insulating housing is designed as a synthetic material housing or plastic housing.

\* \* \* \* \*